United States Patent [19]

Robb

[11] 4,264,192
[45] Apr. 28, 1981

[54] SYSTEM FOR PRE-STRIPPING ALIGNMENT OF COLOR SEPARATIONS

[76] Inventor: Maurice R. Robb, 12240 Arrow Park Dr., Tantallon, Md. 20002

[21] Appl. No.: 87,411

[22] Filed: Oct. 22, 1979

[51] Int. Cl.³ .................... G03B 29/00; G03B 27/32; G01B 11/00
[52] U.S. Cl. ........................ 355/29; 355/32; 355/88; 356/400
[58] Field of Search .............. 355/32, 38, 68, 88, 355/29; 250/557, 561; 356/400, 152; 358/302, 75; 354/7

[56] References Cited
U.S. PATENT DOCUMENTS 4,018,528   4/1977   Dennis .................... 355/32 X
4,171,903  10/1979   Robb ...................... 355/29

*Primary Examiner*—Richard A. Wintercorn
*Attorney, Agent, or Firm*—John F. McClellan, Sr.

[57] ABSTRACT

A system for prestripping alignment of color separations providing automatic registration of same on stripping, includes provision for using a set of carrier-related holes in a first color separation for establishing position of the first color separation on a hole-transfer table, and then for using fiducial indicia on the first color separation to establish position of a sensor system which in turn is used in conjunction with corresponding fiducial indicia on each of the remaining color separations to establish location for corresponding carrier-related holes which are then punched in each color separation using the hole transfer table.

4 Claims, 7 Drawing Figures

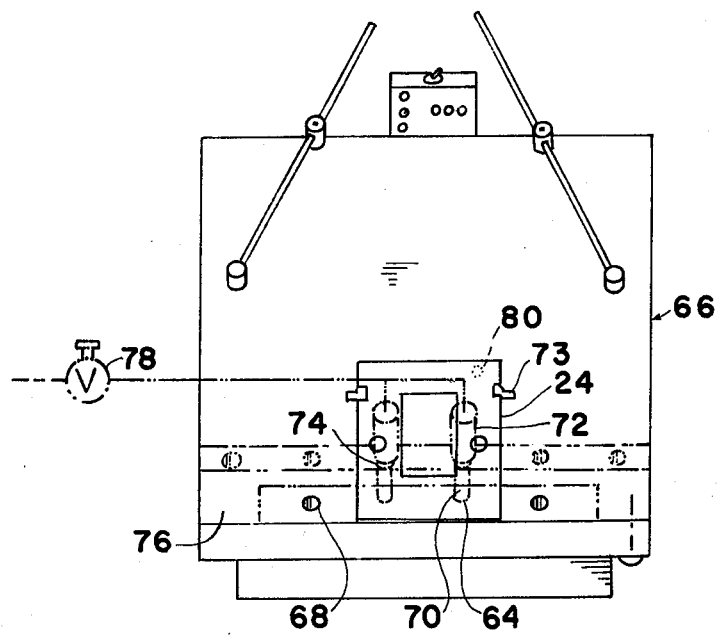
FIG. 3
FIG. 4
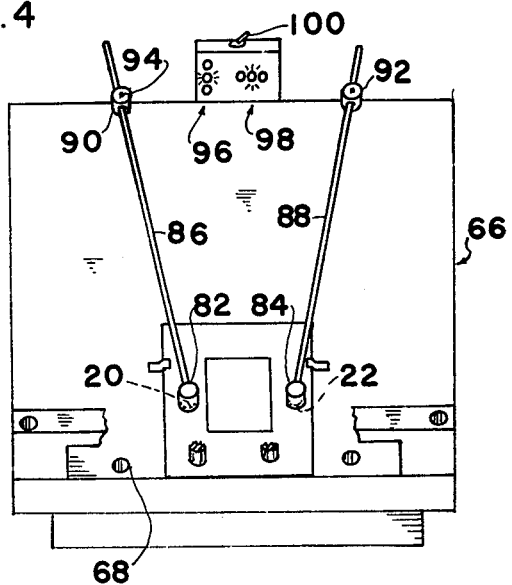

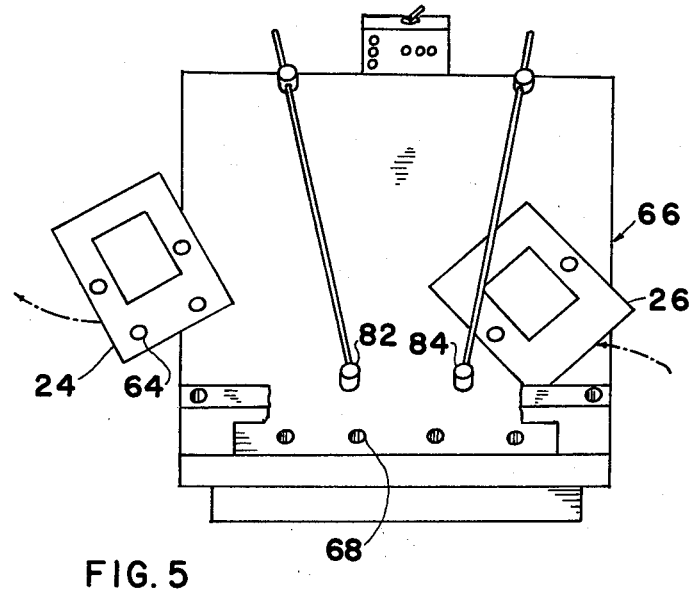
FIG. 5
FIG. 6
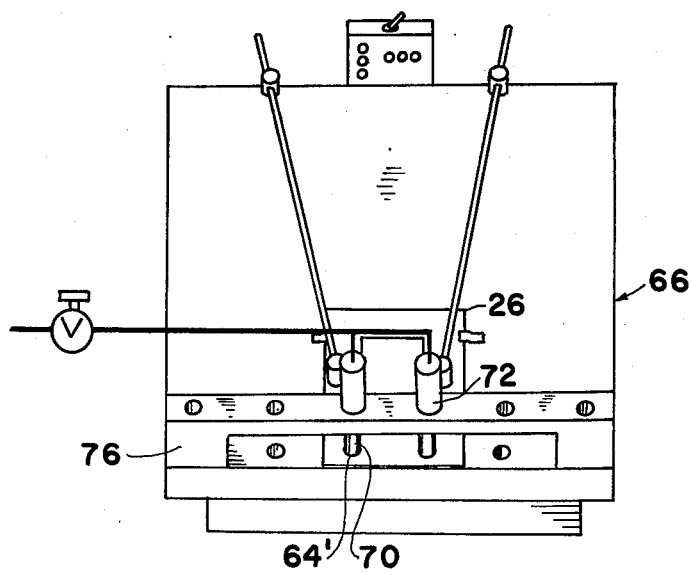

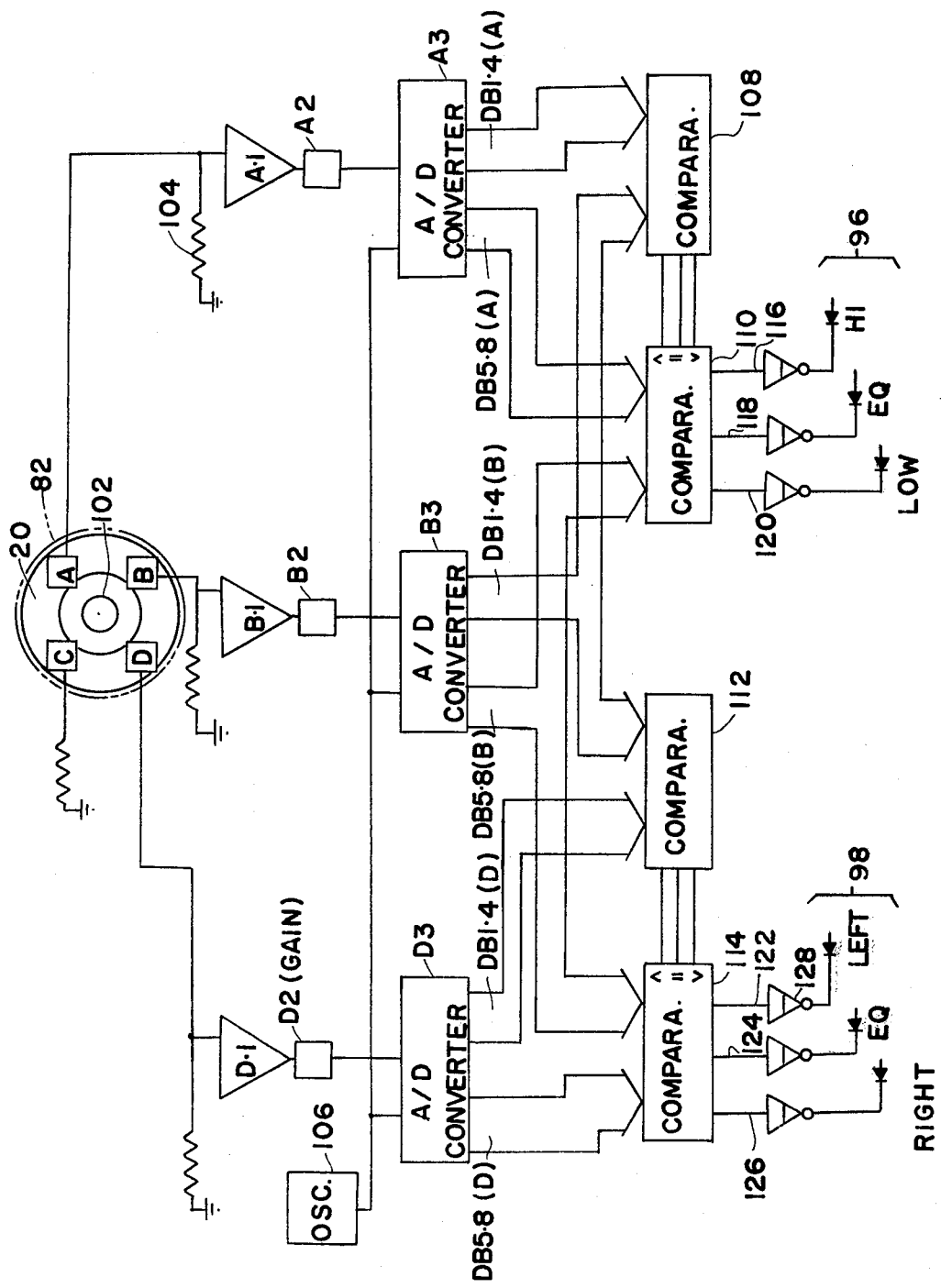

SYSTEM FOR PRE-STRIPPING ALIGNMENT OF COLOR SEPARATIONS

This application is related to, and priority benefit is claimed with respect to, my co-pending application which issued as U.S. Pat. No. 4,171,903 on Oct. 23, 1979, for Variable Punch Press System For Four Color Work.

This invention relates generally to four color separation photography and the like and generally to a system for pre-alignment of color separations to improve stripping.

A principal object of this invention is to provide a system for alignment of color separations which can be used by unskilled labor to produce registration for color work as good as that produced by skilled labor.

In the prior art various systems have been described including the disclosure in my U.S. Pat. No. 4,171,903, issued Oct. 23, 1979.

That Application discloses a system of first and second punching presses for providing automatic registration for four-color image stripping.

In addition to the above, the following brochure describes Japanese-manufacture photoelectric equipment for color separation alignment: "DS Stripping System, Automatic Registering Punches MR 200 B; Rotary Film Stripping Table RT200E,G."

This is believed to describe a system employing photocell-located punches in four color work.

However, it is believed that no combination of known art will provide the advantages of the present system which appear in the objects and description.

Further objects of this invention are to provide a system as described which makes stripping as nearly automatic as possible, which enables unskilled or semi-skilled workers to do uniformly good quality work at a high productivity rate, which requires a minimum of investment, which is economical, durable, safe, and reliable to use, and which takes up little floor space and is portable.

In brief summary given for cursive description only and not as limitation the invention includes a system providing coacting location hole and transfer hole structure with fiducial marking to align in location color separations of a set.

The above and other objects and advantages of this invention will become more readily apparent on examination of the following description, including the drawings, in which like reference numerals refer to like parts:

FIG. 3 is a perspective diagram of apparatus in a thrid step of the invention;

FIG. 4 is a perspective fragmentary diagram of apparatus in a fourth step of the invention;

FIG. 5 is a perspective diagram of apparatus in a fifth step of the invention;

FIG. 6 is a perspective diagram of apparatus in a sixth step of the invention; and FIG. 7 is a schematic diagram of an electrical system.

Figure 1:
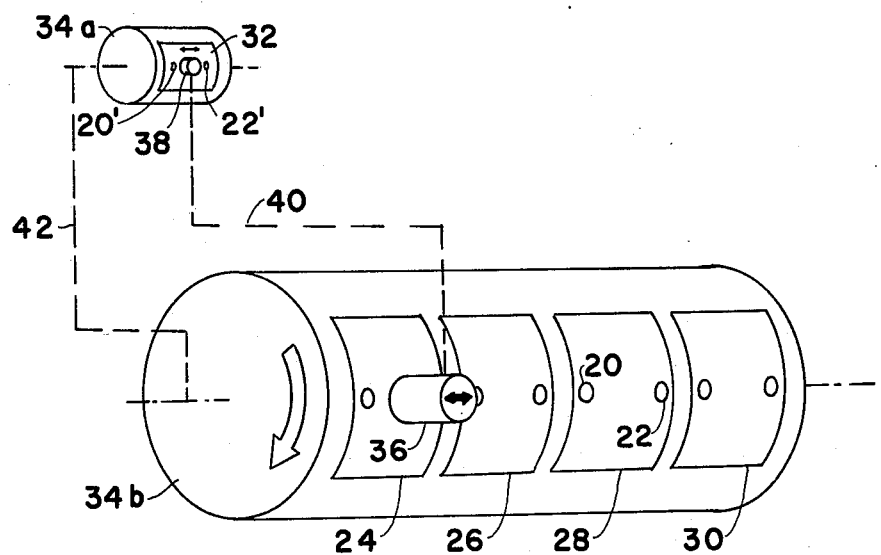
FIG. 1 is a perspective diagram of apparatus for a first step in four color separation process according to the invention.

In the drawings for exposition some of the apparatus has been shown smaller in size than it might preferably be. It will be appreciated that the special table described in relation to the later Figures can readily be 35 by 45 inches (88.9 by 114.3 cm) so as to receive sixteen pieces 8½×11 inches (21.6 by 27.9 cm).

FIG. 1 shows in schematic form the first step in the system for providing for pre-alignment of a plurality of color separations for stripping: The placing of indicia 20, 22 on color separations 24, 26, 28, 30 in locational correspondence with indicia 20', 22' appearing in the margin of the composite or original 32. All indicia correlate with the color separations precisely, and the color separations may be produced in the same step, if desired.

The indicia may be ring shaped bullseyes. They may be conventionally defined by photoengraving as shown here. Conventional scanner separation apparatus may be used for this, represented by input and output or first and second rotary cylinders 34a and 34b with reciprocating light source 36 on the second rotary cylinder following in synchronism a reciprocating (arrow) scanner head 38 on the first rotary cylinder. The dashed line 40 indicates a conventional mechanical or electrical tie synchronizing the reciprocating parts. The dashed line 42 indicates similarly a conventional tie synchronizing rotation of the first and second rotary cylinders. Conventionally, vacuum is used to hold the 35 mm or other original and the color separations on the respective rotary cylinders.

Two scanner pins and holes are typically used in mounting the sheets to the rotary cylinder; these are not shown because conventional and not otherwise used in the present system.

Figure 2:
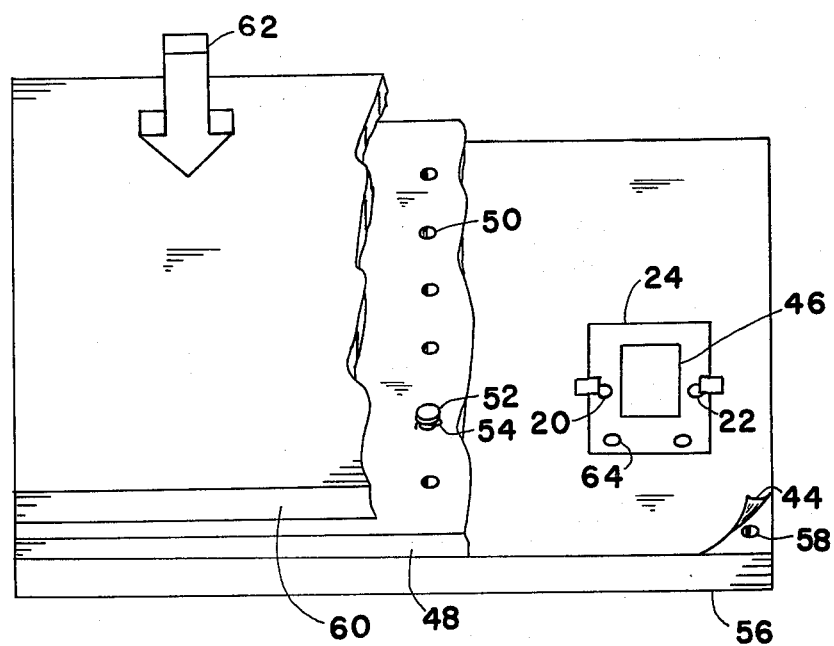
FIG. 2 is a perspective fragmentary diagram of apparatus in a second step in the invention.

FIG. 2 shows the second step, hole-keying a first color separation 24 to a conventional carrier 44 (corner turned up for exposition) in location for burning in at a window 46 in the carrier. (Bullseyes 20, 22 are not used in this step.)

A regular grid of hole making elements in pre-set or pre-determined spacing on center is employed according to this invention for this combinational step.

For the purpose an intermediate punch holder 48 having a grid of holes 50 may hold the punches 52 each of which may have a return spring 54 in place over the die 56 which has a corresponding grid of holes 58. A ram plate 60 may be used to force the punches through the color separation and carrier into selected holes of the grid of holes in the die. Any conventional system for holding these elements and reciprocating the ram plate may be used; arrow 62 represents such.

Means and method in this step may, as indicated here, be like those disclosed in my aforesaid U.S. Pat. No. 4,171,903, issued Oct. 23, 1979.

The result of this step is the production of preset-spacing holes 64 in the margin or non-image portion of the first color separation and corresponding holes in the carrier. As will be explained, in processing succeeding color separations of the set, this step is not used.

FIG. 3 indicates the next step, employing the preset-spacing holes 64 in the first color separation 24 to locate the first color separation on a special table 66 having along the lower edge a line of die holes 68 identical in spacing to that described in the last step, using any suitable hole-fitting pins, such as matrix pins or punch pins. Preferably power punches 70 are used. These are pistons mounted in cylinders 72 screwed or otherwise conventionally detachably affixed at respective holes 74. The holes are in a bridge 76 fixed in parallel spacing slightly above the plane of the table and occur in a series having the same spacing as those of the grid previously described. A four way pneumatic valve 78 provides for adjustment of piston (punch) travel in conventional manner on receiving pressure from a suitable source. Tape 73 may be used to hold the color separation. As an alternative, or in co-action, a conventional vacuum arrangement represented by holes 80 in the table may be used. Punch valve 78 has manual control.

FIG. 4 is a fragmentary view with details of the apparatus shown in the previous Figure removed for exposition. This Figure shows that the indicia 20, 22 are used in the next step for indexing. The indexing apparatus preferably comprises two photoelectric cell heads 82, 84, responsive to the location of the indicia 20, 22 and adjustably positionable in spaced relation over each, as by means of conventional rod-and-clamp holders 86, 88 affixed to the special table 66 by conventional pivots 90, 92 tightenable by screw 94 along with rod extension and orientation. Independent sets of light-readouts 96, 98 for the respective photoelectric cell heads may be used to display the readings indicative of positioning; the two sets of three lights may indicate high, centered, low and left, centered, right, for either photoelectric cell head as selected by a switch 100. The indicia may be illuminated by means built in to the photocell heads or by ambient light. It will be appreciated that magnetic indicia and suitably responsive pickups and displays of conventional design could be used as well, so long as spacing between sensors and the color separation permits free removal and substitution of the color separation.

FIG. 5 indicates the next step in fragmentary view with overlying parts removed for exposition: substituting a second color separation 26 in place of the first color separation 24, by first removing the pins (that is, retracting the pneumatic punches by manual adjustment of the valve) and the first color separation, followed by precisely positioning the second color separation by indexing the indicia relative to the now-adjusted and fixed photoelectric cell heads 82, 84, and thus to the die holes 68 in the special table 66. Tape or other conventional means may be used to hold this position if desired.

FIG. 6 shows a representative final step in this system: power punching pre-set holes 64' in the second color separation 26 (and in turn in every succeeding color separation).

For this the bridge 76 which, as noted, comprises essentially a holder for punch cylinders 72 is employed with the ram provision for driving pins or punches 70 through the color separation, the special table 66 serving as a die.

FIG. 7 is an electrical schematic, diagramming a conventional circuit which may be used for each photoelectric cell head (82 indicated).

Each indicia (20 shown) or target ring is illuminated by a light 102 in the photocell head.

Position of the target ring is sensed by a quadrant array of conventional photodiodes A, B, C, D, fixed in the photoelectric cell head.

Each photodiode is terminated by a load resistance 104, which may be 100 thousand ohms.

The outputs of A, B and D are amplified adjacent using linear variable gain amplifier A1, B1, D1 which may be of the type made by a number of manufacturers under the commercial designation G-10-100(2-741).

Gain is conventionally adjusted at A2, B2, D2, respectively to produce equal signals at the inputs of corresponding analog-to-digital converters A3, B3, D3, which may be TELE-8703 chips, conventionally wired according to the commercial data sheets. An oscillator supply 106 connects conventionally with the converters.

The A/D conversion shown has 8-bit resolution; more or less can be used as desired for the alignment accuracy. The digital outputs of the three A/D converters are used as inputs to four-bit comparators 108, 110, 112, 114, which may be of the type MC14585 commercially available from several manufacturers. The designated terminals DB1-4 and DB5-8 (A, B and D) have connection with the four comparators such that an eight-bit comparison is made.

The outputs >, < and = are used to turn on the indicator lights showing location on the bullseye. If the target bullseye is not centered on the four quadrants, "A" signal is greater than "B" signal and the "HI" circuit 116 energizes; for the converse the "LOW" light circuit 120 operates, when centered "EQUAL" light circuit 118 operates. Similarly left, right and equal circuits 122, 126, 124, give those indications.

The bullseye is aligned when the A=B and B=D signal conditions are satisfied. Power drivers 128 may be the commercially available units designated as ULN2004.

This invention is not to be construed as limited to the particular forms disclosed herein, since these are to be regarded as illustrative rather than restrictive. It is, therefore, to be understood that the invention may be practiced within the scope of the claims otherwise than as specifically described.

What is claimed and desired to be protected by Unites States Letters Patent is:

1. A method for providing for pre-alignment of a plurality of color separations for stripping comprising:
 (a) photographically producing identical indicia on each of said plurality of color separations during the making of said color separation;
 (b) hole-keying a first color separation directly to a carrier using pre-set spacing of the holes by punching simultaneously through a portion of the first color separation and the carrier;
 (c) employing said pre-set spacing holes to locate the first color separation on a punch table by placing pins through said punched holes and into die holes in the punch table having said pre-set spacing;
 (d) indexing respective indicator means on said indicia in position clear of the first color separation and fixing in said position said respective indicator means;
 (e) substituting a second color separation in place of the first color separation by removing said pins and first color separation and locating the second color separation by indexing said indicia on the indicator means; and
 (f) punching holes in the second color separation on said pre-set spacing on said die table; thereby providing for pre-alignment for said plurality of color separations for stripping using said punched holes on said pre-set spacings.

2. In a method as recited in claim 1, in step (c) said placing of pins being by placing of power punches fixed on said pre-set spacing.

3. In a method as recited in claim 2, said power punches being punches used for said punching holes in step (f).

4. In a system for producing pre-alignment holes for stripping in a plurality of color separations, a table, a bridge affixed to the table, a plurality of punches having detachable affixation to the bridge, means for aligning the plurality of punches respectively over selected holes of a row of holes in an end of the table; identical indicia on each of the plurality of color separations, and means for indexing on said identical indicia on each color separation and aligning each color separation with the plurality of punches.

* * * * *